US006492188B1

(12) United States Patent
Lin et al.

(10) Patent No.: US 6,492,188 B1
(45) Date of Patent: Dec. 10, 2002

(54) MONITOR METHOD FOR QUALITY OF METAL ARC (ANTIREFLECTION COATING) LAYER

(75) Inventors: Tsai-Sen Lin, Hsin-Chu (TW); Bor-Shiun Wu, Hsin-Chu (TW); Chou-Shin Jou, Hsin-Chu (TW); Tings Wang, Hsin-Chu (TW)

(73) Assignee: Mosel Vitelic Incorporated, Hsin-Chu (TW)

( * ) Notice: Subject to any disclaimer, the term of this patent is extended or adjusted under 35 U.S.C. 154(b) by 0 days.

(21) Appl. No.: 09/265,962

(22) Filed: Mar. 11, 1999

(30) Foreign Application Priority Data

Jan. 11, 1999 (CN) .......................................... 88100298

(51) Int. Cl.$^7$ ...................... G01R 31/26; H01L 21/66; H01L 21/302
(52) U.S. Cl. ............................ 438/17; 438/14; 438/714
(58) Field of Search .............................. 438/14, 15, 16, 438/17, 18, 714; 156/626

(56) References Cited

U.S. PATENT DOCUMENTS 4,316,765 A * 2/1982 Thiel .......................... 156/626
5,386,796 A * 2/1995 Fusegawa et al. ............. 117/13
5,624,769 A * 4/1997 Li et al. ........................ 429/32
5,767,018 A * 6/1998 Bell ............................. 438/696
5,827,777 A * 10/1998 Schinella et al. ............ 438/629
5,913,105 A * 6/1999 McIntyre et al. .............. 438/16
5,946,543 A * 8/1999 Kimura et al. ................ 438/14
6,004,884 A * 12/1999 Abraham ..................... 438/714

* cited by examiner

Primary Examiner—John F. Niebling
Assistant Examiner—Viktor Simkovic
(74) Attorney, Agent, or Firm—Bacon & Thomas

(57) ABSTRACT

The present invention relates to a monitor method for quality of metal Antireflection Coating (ARC) layer and, more particularly, to a fast and accurate monitor method for quality of metal ARC layer. By using of immersing a silicon wafer comprising an ARC layer into an acidic (such as a developer) or an alkalescent solution for about 200–300 seconds, according to the present invention, at weak points of the metal ARC layer there occur voids (defects) due to a Galvanic cell effect enhanced by these chemical solutions and then how many defects can be counted by a wafer defect inspector such as a KLA instrument so that quality of the metal ARC layer can be monitored by this defect number. Besides, Since the silicon wafer used as a sample for the wafer defect inspector simply comes from a production line, i.e. a developing process, rather than from other additional processing, said method allows for fast and accurately monitoring quality of the metal ARC layers.

10 Claims, 2 Drawing Sheets

MONITOR METHOD FOR QUALITY OF METAL ARC (ANTIREFLECTION COATING) LAYER

DESCRIPTION OF THE PRIOR ART

Semiconductor devices are fabricated step-by-step, beginning with a silicon wafer (substrate), implanting various ions, depositing insulating and conductive layers. Some of these layers are subsequently etched by using a patterned photoresist as a mask to create various circuit structures; wherein these pattern transferring processes substantially include a photolithography process, transferring a pattern of a mask to a photoresist layer overlying the silicon wafer, and then a dry etching process, transferring a pattern of the photoresist layer to these insulating or conductive layers by selectively removing unmasked area thereof. However, it is often difficult to obtain a faithful pattern on the photoresist layer overlying highly reflective layers during the photolithography process because the amount of exposing light that the layers reflect can partially expose some of the photoresist. The major highly reflective layers are metal layers such as aluminum or gold. This problem becomes more significant as the patterns become finer because the amount of reflected light has a greater relative effect on exposing a thin line, which casts a narrow shadow, than a thick line, which casts a wide shadow. Therefore, It is needed to have an Antireflection Coating (hereinafter referred as ARC) layer on top of the highly reflective layers to improve the resolution of the photoresist pattern and subsequent precision of the pattern in the reflective layers. Most material of the ARC layer is TiN.

Since the silicon wafer has finished most processes of whole integrated circuit wherein even more includes a multilevel metalliztion structure before forming the ARC layer, its surface topology is such uneven that weak points of the followed formed ARC layer often occur at recess regions. When the silicon wafer is immersed in an acidic solution, for example, a developer or an alkalescent solution, these solutions will diffuse from these weak points of the ARC layer into the underlying highly reflective layer such as metal layer, as shown in FIG. 1. After forming a first metal pattern 20 atop a silicon wafer (substrate) 10, an interlevel dielectric layer 30 such as oxide, a second metal layer 40 such as aluminum to be formed a second metal pattern in following processes, and a thickness of 300–500 angstroms of ARC layer 50 such as TiN are formed in this sequence, shown in FIG. 1. As aforesaid, if the silicon wafer is immersed in an acidic or alkalescent solution, these solutions will diffuse from weak points A (generally at recess regions) and that will result in a Galvanic cell effect. The Galvanic cell effect is substantially an electrochemical battery and comprises the second metal layer 40 as an anode, the ARC layer as a cathode, and the acidic or alkalescent solution as electrolyte, thereby the second metal layer 40 electrolyzed and etched to form voids at these recess regions, as shown in a double-declined line area of FIG. 1, which further make the second metal layer 40 lose its integrity, increase its resitivity, and even more form an open circuit, thus considerably lowering reliability of product.

Except that said recess regions of surface topology of the silicon wafer may form weak points, it is inevitable that some particles, coming from a chamber and co-deposited on the silicon wafer during a sputter depositing process of ARC material of TiN, also may form these weak points and deteriorate quality of the ARC layer. For the time being, there is no other method to monitor quality of the ARC layer except by an inference from back-end test of electric parameters of the silicon wafer and thus yield of product will be lowered because a timely reworking process can't be applied to the bad quality of the ARC layer. Therefore, it is needed to propose a monitor method for quality of the ARC layer allowing for obtaining a fast and accurate response to remind operators applying a timely reworking process, thereby raising yield of product.

SUMMARY OF INVENTION

Therefore, an object of the invention is to provide a monitor method for quality of the ARC layer allowing for obtaining a fast and accurate response to remind operators applying a timely reworking process, thereby raising yield of product.

It is another object of the invention to provide an in-line monitor method for quality of the ARC layer because of its sample wafer prepared from a production line, i.e. a developing Process.

By immersing a silicon wafer comprising an ARC layer into an acidic (such as developing solution) or alkalescent solution for about 200–300 seconds, according to the present invention, the weak points of the metal ARC layer which occur as voids (defects) due to a Galvanic cell effect enhanced by these chemical solutions and then counting the number of defects by a wafer defect detector such as a KLA instrument so that the quality of the metal ARC layer can be monitored by this defect number. Since the silicon wafer used as a sample for the wafer defect detector comes from a production line, i.e. a developing process, rather than from other additional processing, this method allows for fast and accurately monitoring quality of the metal ARC layer.

BRIEF DESCRIPTION OF THE DRAWINGS

The invention itself, however, as well as other features and advantages thereof, will be best understood by reference to the detailed description which follows, read in conjunction with the accompanying drawings, wherein.

DESCRIPTION OF THE PREFERRED EMBODIMENT

Figure 1:
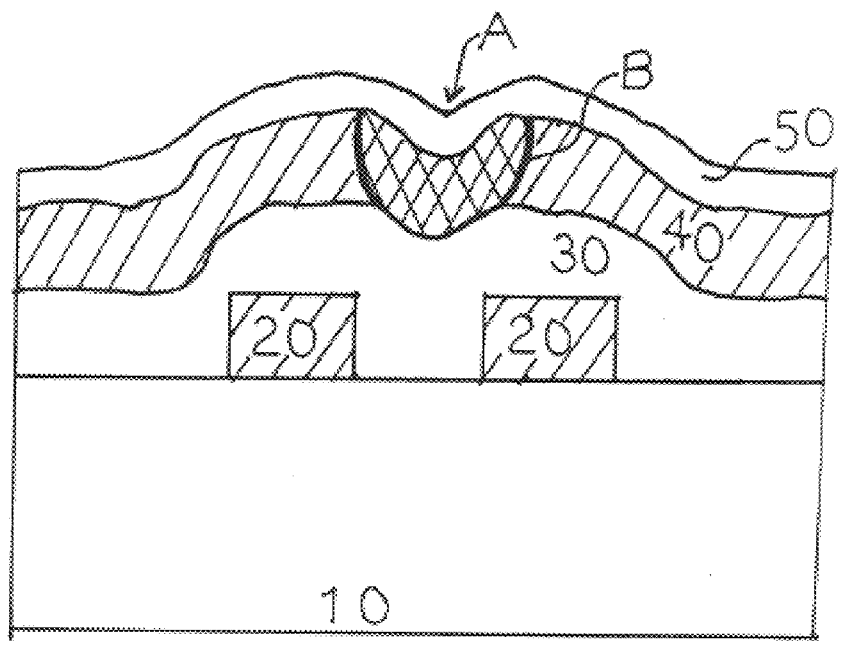
FIG. 1 illustrates how a Galvanic cell effect happens.

As aforementioned, a silicon wafer comprising an ARC layer is prepared as the following. A first metal pattern 20 is formed over a silicon wafer (substrate) 10, followed by forming an interlevel dielectric (ILD) layer 30 such as oxide, a second metal layer 40 such as aluminum which is to be formed a second metal pattern in following processes, and a thickness of 300–500 angstroms of ARC layer 50 such as TiN in this sequence over the first metal pattern 20, shown in FIG. 1. After immersing the silicon wafer 10 into an acidic or alkalescent solution, there happens a Galvanic Cell effect, which is substantially an electrochemical battery and comprises the second metal layer 40 as an anode, the ARC layer 50 as a cathode, and the acidic or alkalescent solution as electrolyte, thereby the second metal layer 40 electrolyzed, etched to form voids at these recess regions, as shown in a double-declined line area of FIG. 1, and forming a product of $Al_2O_3$ material at circumference B thereof.

Figure 2:
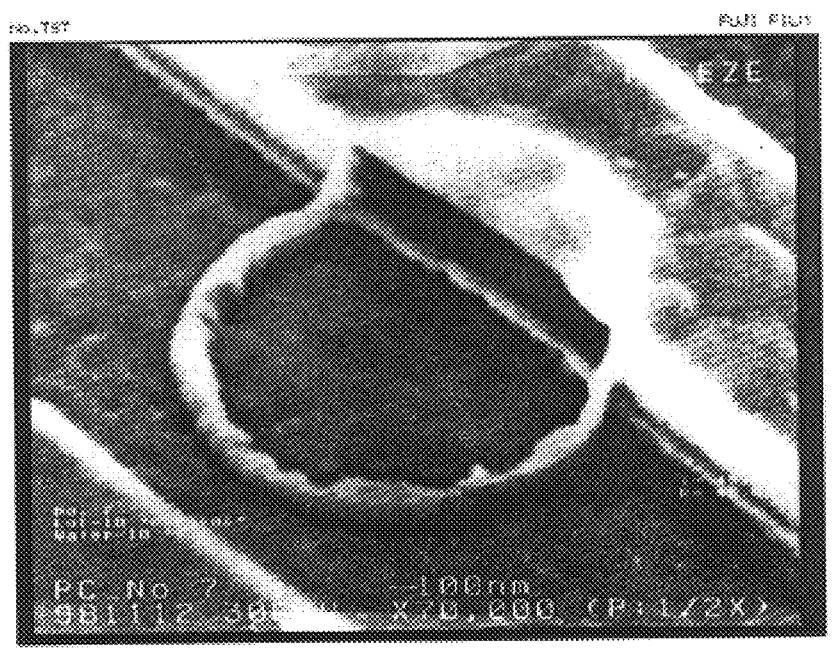
FIG. 2 is a Scanning Electronic Microscopy(SEM) picture of FIG. 1 after metal dry etching, according to the present invention.

The silicon wafer 10 is then immersed into an acidic solution such as a developer, or an alkalescent solution for about 200–300 seconds, which is longer than standard developing time of 90 seconds, according to the present invention, so as to enhance the Galvanic cell effect to enlarge voids formed by an electrolysis of the second metal layer 40 and furthermore damage the ARC layer 50 more seriously in order to be easily inspected by a wafer defect inspector. A Scanning Electronic Microscopy (SEN) picture of the silicon wafer 10 after metal dry etching is shown in FIG. 2, wherein the Galvanic cell effect happens at regions where the second metal layer 40 should be etched and forms a white arc strip of $Al_2O_3$ (i.e. top view of circumference B of FIG. 1) after metal dry etching due to its very low etching rate. Thus the white, arc strip will protect underlying metal to form a residual metal so as to short neighbour metal lines and further lower product yield. As aforesaid, if the Galvanic cell effect happens at regions where are designed metal lines, voids are then formed and thus make these metal lines lose their integrity and increase their resistivity, even more forming an open circuit. Therefore, quality of the ARC layer is a key factor affecting yield and reliability of product.

Figure 3:
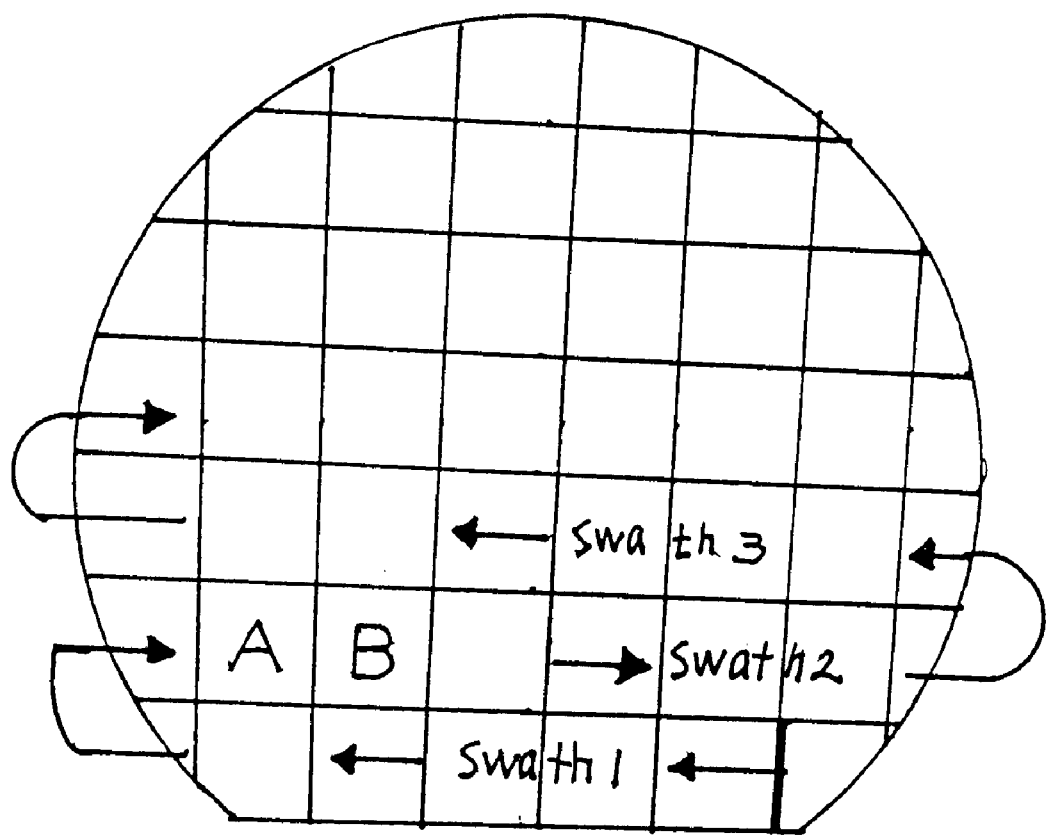
FIG. 3 illustrates a wafer scanning route of a wafer defect inspector, such as a KLA instrument, according to the present invention.

Since there are image differences between voids and their neighbours observing from a microscope, according to the present invention, those will be easily inspected by image subtraction of the wafer defect inspector such as a KLA instrument. The working principle of the wafer defect inspector is briefly introduced as follows. The wafer defect inspector, for example a KLA, instrument, is originally used to inspect defect numbers of particles and their distributions and its scanning route likes movement off a serpentine, as shown swath 1 to swath 3 of FIG. 3, but it is used to inspect number of voids in the present invention. When the wafer defect inspector inspects a die, for example a die index B', it uses a pattern of the die B' and that of a die A', which is right left to the die B' in FIG. 1, as inputs and executes an image subtraction of both die patterns, at last displaying a differentiated result as an output in a monitor. Since most areas of the wafer have no Galvanic cell effect, if there is any differentiated result, i.e. defects, showned on the output monitor, it is certainly a void where the Galvanic cell effect happens. Therefore, number of voids resulting from the Galvanic cell effect, which represents quality of the ARC layer, can be monitored by number of defects counting from the output monitor of the wafer defect inspector, such as a KLA instruments. If quality of the ARC layer is unacceptable, according to aforesaid, there are two resulting factors of which one is impurity particles coming from chamber's wall during sputtering ARC material of TiN and the other is uneven surface topology of the wafer. In order to eliminate these two factors, the sputtering chamber should be maintained and surface topology of the wafer should be improved before the ARC layer with unacceptable quality is stripped away and reworked again. Therefore, a method for ameliorating quality of the ARC layer can be applied to increase yield of product in the present invention, compared with Prior art that there is no monitor and curing method for quality of the ARC layer. Besides, the silicon wafer used as a sample for the defect inspector simply comes from a production line, i.e. a developing Process, rather than from other additional processing, thereby allowing the monitor method of the present invention to be an in-line method; in other words, this method can feed back a fast and accurate response to remind operators timely applying the amelioration method for quality of the ARC layer, thereby raising yield of product.

While Particular embodiment of the present invention has been illustrated and described, it would be obvious to those skilled in the art that various other changes and modifications can be made with departing from the spirit and scope of the inventions. It is therefore intended to cover in the appened claim all such changes and modifications that are within the scope of the present invention.

What is claimed is:

1. A method for monitoring the quality of a metal ARC layer in a semiconductor device, which device is prepared by forming a first metal pattern atop a silicon wafer, followed by forming an interlevel dielectric layer, a second metal layer and an ARC layer over the first metal pattern, said method comprising the steps of:

immersing the silicon wafer containing the ARC layer into an acidic or alkalescent solution for 200–300 seconds to enhance a Galvanic cell effect; and inspecting the silicon wafer by a wafer defect inspector and then monitoring the quality of the ARC layer by counting number of defects from the output monitor of the wafer defect inspector.

2. The method of claim 1, wherein material of the interlevel dielectric layer is oxide.

3. The method of claim 1, wherein the material of the second metal layer is aluminum.

4. The method of claim 1, wherein the material of the ARC layer is TiN.

5. The method of claim 1, wherein the acidic solution is a developer.

6. The method of claim 1, wherein the acidic solution can be replaced by an alkalescent solution.

7. The method of claim 1, wherein the wafer defect inspector is a KLA instrument.

8. The method of claim 1, wherein after monitoring the quality of the ARC layer and determining that this result is unacceptable, applying a amelioration method to the silicon wafer which further comprises maintaining sputtering chamber and improving surface topology of the wafer before the ARC layer is stripped away and reworked again.

9. The method of claim 1 wherein the silicon wafer is removed from a production line.

10. The method of claim 8, wherein the silicon wafer is removed from a production line.

* * * * *